United States Patent
Hsu et al.

(10) Patent No.: US 11,107,671 B2
(45) Date of Patent: Aug. 31, 2021

(54) METHOD OF PROCESSING SEMICONDUCTOR SUBSTRATE

(71) Applicant: TAIWAN SEMICONDUCTOR MANUFACTURING CO., LTD., Hsinchu (TW)

(72) Inventors: Wei-Chih Hsu, Miaoli County (TW); Kai-Lin Chuang, Chiayi (TW); Yuan-Chi Chien, Taichung (TW); Jeng-Huei Yang, Taichung (TW); Jun-Xiu Liu, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 185 days.

(21) Appl. No.: 16/391,098

(22) Filed: Apr. 22, 2019

(65) Prior Publication Data
US 2019/0252181 A1 Aug. 15, 2019

Related U.S. Application Data

(62) Division of application No. 14/918,243, filed on Oct. 20, 2015, now Pat. No. 10,269,557.

(51) Int. Cl.
| | |
|---|---|
| *H01L 21/02* | (2006.01) |
| *B08B 17/00* | (2006.01) |
| *H01L 21/67* | (2006.01) |
| *B08B 3/04* | (2006.01) |
| *B08B 13/00* | (2006.01) |
| *H01L 21/306* | (2006.01) |
| *H01L 21/687* | (2006.01) |

(52) U.S. Cl.
CPC ........ *H01L 21/02057* (2013.01); *B08B 3/04* (2013.01); *B08B 13/00* (2013.01); *B08B 17/00* (2013.01); *H01L 21/30604* (2013.01); *H01L 21/67017* (2013.01); *H01L 21/67057* (2013.01); *H01L 21/67086* (2013.01); *H01L 21/68735* (2013.01)

(58) Field of Classification Search
None
See application file for complete search history.

(56) References Cited

U.S. PATENT DOCUMENTS

| | | | | |
|---|---|---|---|---|
| 4,557,785 | A | * 12/1985 | Ohkuma | C23F 1/08 156/345.18 |
| 5,312,487 | A | * 5/1994 | Akimoto | H01L 21/6715 118/52 |
| 5,451,260 | A | 9/1995 | Versteeg et al. | |
| 5,591,262 | A | * 1/1997 | Sago | H01L 21/67051 118/52 |

(Continued)

*Primary Examiner* — Allan W. Olsen
(74) *Attorney, Agent, or Firm* — Maschoff Brennan

(57) ABSTRACT

A method includes disposing a semiconductor substrate over a chuck. The chuck has a plurality of holes therein. The semiconductor substrate has a first surface facing the chuck and a second surface opposite thereto. A liquid layer is formed flowing over a top surface of the chuck by supplying liquid to the top surface of the chuck through the holes of the chuck. The semiconductor substrate is moved toward the chuck such that the first surface of the semiconductor substrate is in contact with the liquid layer and the liquid layer flows between the first surface of the semiconductor substrate and the top surface of the chuck.

20 Claims, 8 Drawing Sheets

(56) References Cited

U.S. PATENT DOCUMENTS

| | | | |
|---|---|---|---|
| 5,609,720 | A | 3/1997 | Lenz et al. |
| 5,863,396 | A | 1/1999 | Flanigan |
| 6,102,057 | A * | 8/2000 | Vogtmann ............... H01L 21/68 |
| | | | 134/144 |
| 6,113,698 | A | 9/2000 | Raaijmakers et al. |
| 6,793,769 | B2 | 9/2004 | Kajino et al. |
| 6,827,814 | B2 | 12/2004 | Taniyama et al. |
| 6,858,092 | B2 * | 2/2005 | Langen ............. H01L 21/67051 |
| | | | 134/33 |
| 7,160,392 | B2 | 1/2007 | Shang et al. |
| 7,223,308 | B2 | 5/2007 | Pancham et al. |
| 8,206,549 | B2 | 6/2012 | Nam et al. |
| 8,419,891 | B2 | 4/2013 | Choi |
| 2003/0188687 | A1 | 10/2003 | Paisley et al. |
| 2005/0009349 | A1 * | 1/2005 | Kassir ............... H01L 21/30608 |
| | | | 438/689 |
| 2008/0121251 | A1 * | 5/2008 | Miya .................... B08B 7/0014 |
| | | | 134/4 |
| 2008/0280453 | A1 * | 11/2008 | Koelmel ............. H01L 21/6838 |
| | | | 438/758 |
| 2009/0308538 | A1 | 12/2009 | Yonekura et al. |
| 2010/0248446 | A1 * | 9/2010 | Liu .................... H01L 21/6838 |
| | | | 438/459 |
| 2014/0065553 | A1 | 3/2014 | Jang et al. |
| 2015/0079701 | A1 * | 3/2015 | Yamashita .......... H01L 21/6838 |
| | | | 438/5 |
| 2015/0243542 | A1 * | 8/2015 | Yoshihara ........... H01L 21/6708 |
| | | | 156/345.15 |
| 2016/0195579 | A1 | 7/2016 | Simmons et al. |
| 2017/0110315 | A1 * | 4/2017 | Hsu ................... H01L 21/02057 |

* cited by examiner

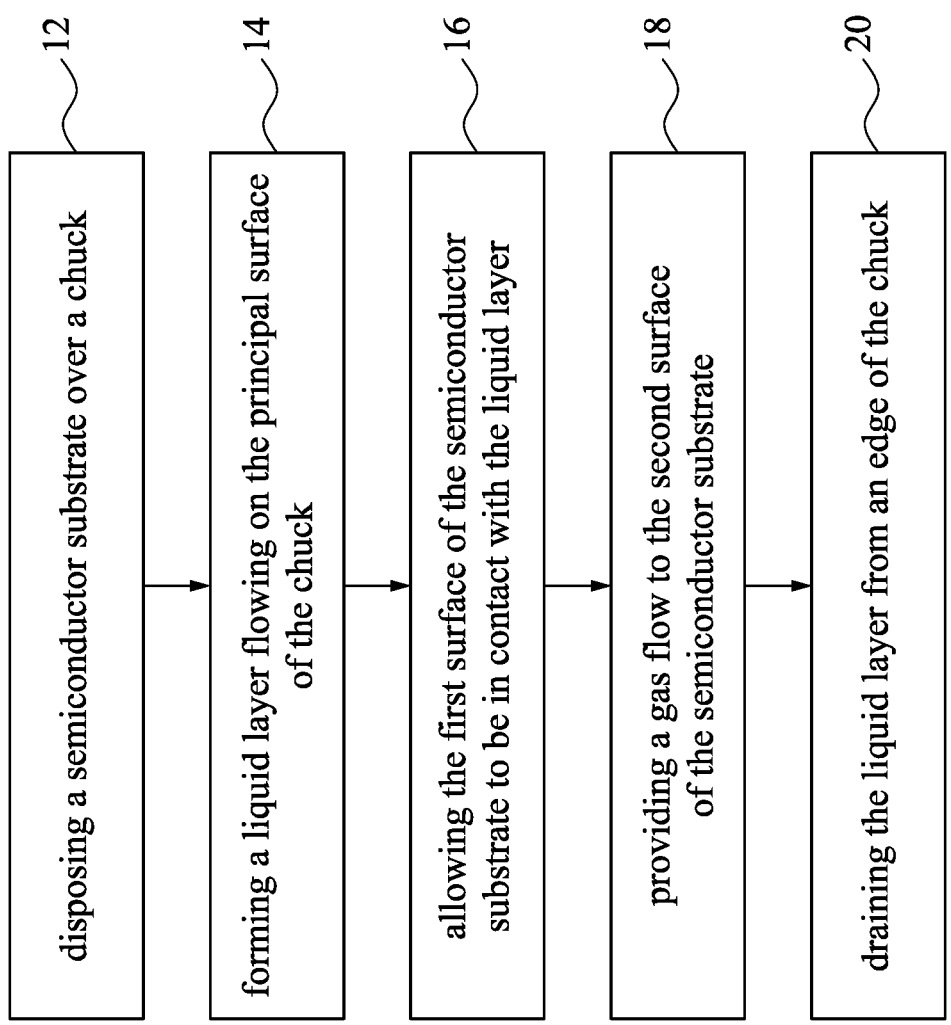

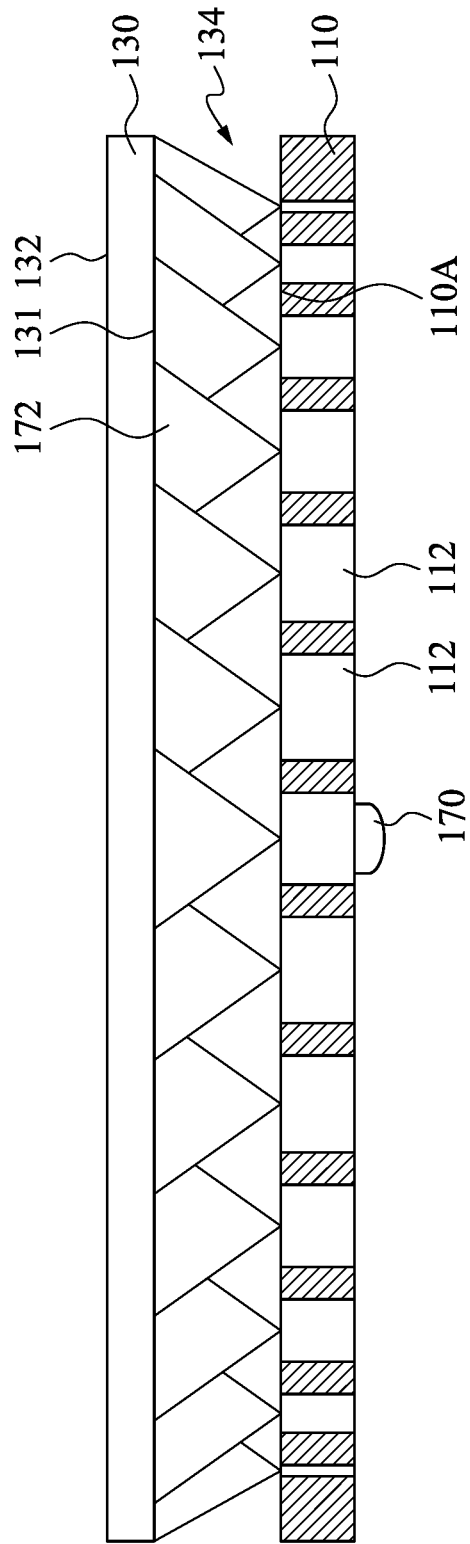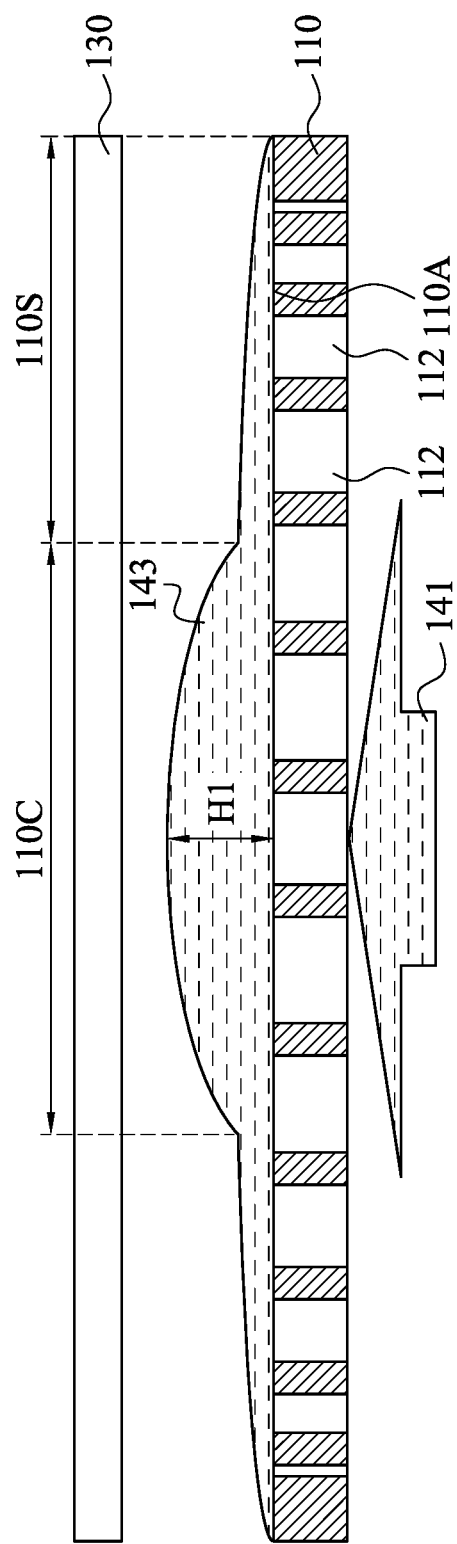

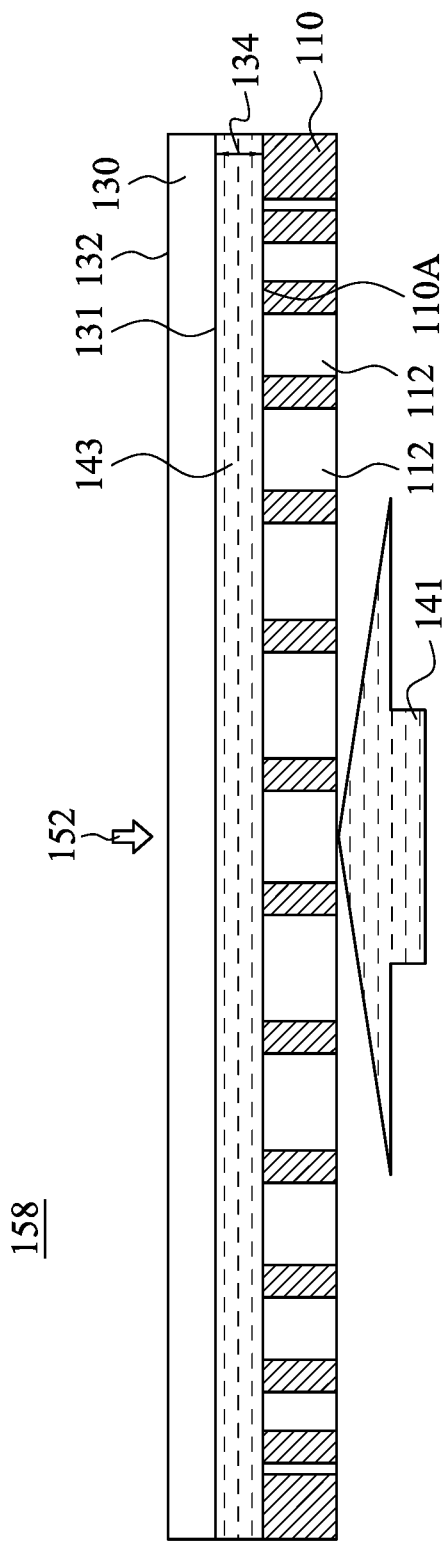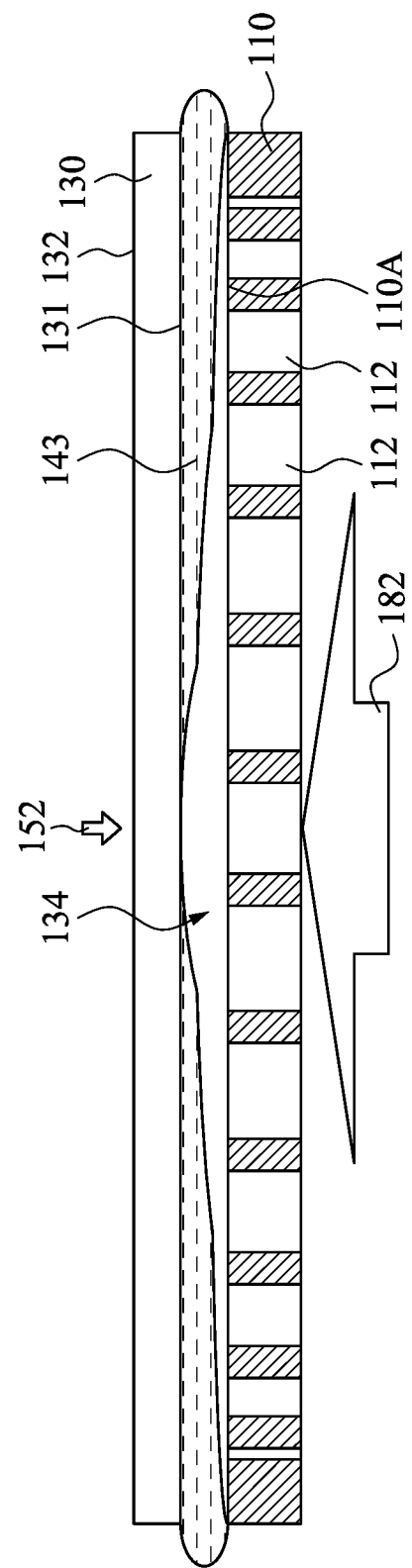

METHOD OF PROCESSING SEMICONDUCTOR SUBSTRATE

CROSS-REFERENCE TO RELATED APPLICATION

This application is a divisional application of U.S. patent application Ser. No. 14/918,243, filed Oct. 20, 2015, now U.S. Pat. No. 10,269,557, issued Apr. 23, 2019, which is incorporated herein by reference in its entirety.

BACKGROUND

The semiconductor integrated circuit (IC) industry has experienced rapid growth. Technological progress in IC manufacture has produced several generations of ICs, and each generation fabricates smaller and more complex circuits than the previous generation. Currently, the semiconductor industry has progressed into nanometer technology nodes for higher device density and better electrical performance, and three-dimensional designs, such as fin-like field effect transistors (FinFETs) are employed. Cleaning processes and wet etching processes are important in manufacturing ICs with nanometer scale features. A variety of cleaning apparatuses and wet etching apparatuses have been proposed by tool vendors, but conventional techniques have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a flow chart illustrating a method of processing a semiconductor substrate according to various embodiment of the present disclosure.

FIGS. 4-11 are cross-sectional views schematically illustrating a method of processing a semiconductor substrate in various process stages according to various embodiment of the present disclosure.

DETAILED DESCRIPTION

Figure 1:
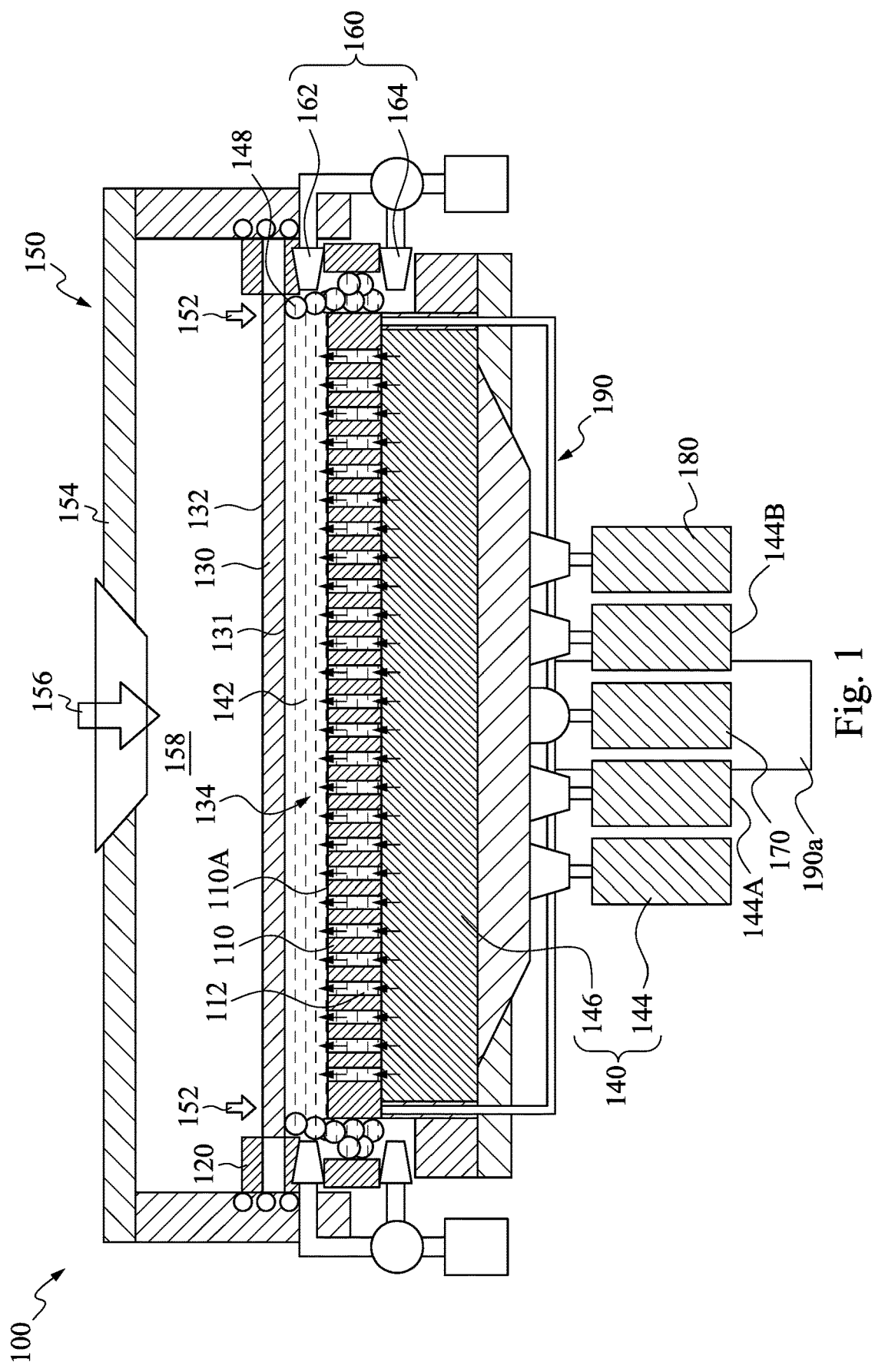
FIG. 1 is a cross-sectional view schematically illustrating an apparatus of processing a semiconductor substrate according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Cleaning and/or wet etching processes are important for manufacturing semiconductor integrated circuits (ICs). Generally, a semiconductor substrate such as for example a silicon wafer has a back surfaces and a device surface on which semiconductor devices are formed. In some cleaning and/or wet etching processes, it is desired that the cleaning or etching effects occur only on a single surface of the semiconductor substrate (i.e. processing surface), whereas the other surface (i.e. non-processing surface) is undesired to be affected by the working mediums such as for example cleaning and/or etching liquids. However, in conventional cleaning and/or wet etching apparatuses, the working mediums is inevitably splashed or moved onto the non-processing surface (also known as "backwash"), and leading to some problems. The conventional cleaning and/or wet etching tools can not promise the non-processing surface being absolutely free of the working mediums. One approach to resolve this problem is to form a protective layer covering the non-processing surface of the semiconductor substrate. This approach is cost-ineffective. Moreover, some nanometer structures such as for example the fin features of FinFETs are possibly broken when using conventional cleaning and/or wet etching apparatuses to manufacture modern ICs.

The present disclosure relates generally to an apparatus of processing a semiconductor substrate and a method of processing a semiconductor substrate. According to various embodiments of the present disclosure, the apparatus and method disclosed herein can reliably promise the non-processing surface being free of the working mediums. Furthermore, the apparatus and method disclosed herein resolve the broken issue of nanometer structures in the cleaning processes and/or wet etching processes.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 is a cross-sectional view schematically illustrating an apparatus 100 of processing a semiconductor substrate according to various embodiments of the present disclosure.

The apparatus 100 includes a chuck 110, holder 120, a liquid supplying system 140 and a positive pressure unit 150.

The chuck 110 serves as a platform on which processes are performed. Specifically, the chuck 110 has a principal surface 110A and one or more holes 112 formed thereon. In some embodiments, the principal surface 110A of the chuck 110 extends in a substantially horizontal direction. The area or the size of the chuck 110 may be varied, depending upon the size of the semiconductor substrate to be processed. In some embodiments, a number of holes 112 are formed on the principal surface 110A. Each of the holes 112 has an outlet on the principal surface 110A, and therefore working mediums such as etching chemicals and cleaning liquid may be provided onto the principal surface 110A through the holes 112. In specifics, each of the holes 112 is connected to the liquid supplying system 140, and the working mediums may be supplied to the principal surface 110A of the chuck 110. Accordingly, various processes may be carried out over the principal surface 110A of the chuck 110.

The liquid supplying system 140 is configured to provide a liquid film 142 onto the principal surface 110A through the hole(s) 112 of the chuck 110. The liquid supplying system 140 includes a liquid supplier 144 which is connected to one or more holes 112 and supplies liquid to the principal surface 110A through the hole(s) 120 of the chuck 110. The supplied liquid flows on the principal surface 110A and thus forming a liquid film 142 flowing on the principal surface 110A of the chuck 110. In some embodiments, the liquid supplying system 140 includes a number of liquid suppliers such as liquid suppliers 144, 144A and 144B. The liquid suppliers 144, 144A, 144B are connected to one or more holes 112 and supply different materials or chemicals to the principal surface 110A. For example, the liquid suppliers 144, 144A, 144B may supply etching chemicals and/or cleaning solutions to the principal surface 110A, and therefore the liquid film 142 may be an etching liquid film or a cleaning liquid film. In yet some embodiments, the liquid supplying system 140 further includes a distributor 146 which is interconnected between the holes 112 and the liquid suppliers 144, 144A, 144B. The materials or chemicals from the liquid suppliers 144, 144A and 144B are reliably mixed in the distributor 146 and then are distributed and transported to the holes 112.

The holder 120 is disposed to hold a semiconductor substrate 130 at a position above the principal surface 110A of the chuck 110. Any type of wafer holders known in the art may be used in the present disclosure. In some embodiments, the holder 120 may clamp the edge of the semiconductor substrate 130, and is moveable in a vertical direction. For example, the holder 120 may be positioned at a relatively high position when receiving the semiconductor substrate 130. And then, the semiconductor substrate 130 may be moved downwards with the holder 120 to a relatively low position to carry out some processes such as for examples etching processes and/or cleaning processes. In some embodiments, the holder 120 may be programmably controlled so that the gap 134 between the semiconductor substrate 130 and the principal surface 110A may be varied during the process time. In yet some embodiments, the holder 120 may be combined with a robot, and may pick up the semiconductor substrate 130 from a cassette and further support it at a desired position above the principal surface 110A of the chuck 110. The chuck 110 may be formed of a material such as for example stainless steel, titanium alloy, aluminum alloy, or the like.

The semiconductor substrate 130 is supported at a level above the principal surface 110A of the chuck 110 by the holder 120 when the apparatus 100 is under operation. Further, the semiconductor substrate 130 has a first surface 131 to be processed and a second surface 132 opposite to the first surface 131. When the apparatus 100 is under operation, the first surface 131 of the semiconductor substrate 130 faces down and opposite to the principal surface 110A of the chuck 110. The first surface 131 is spaced apart from the principal surface 110A by the gap 134 during the process time, and therefore the liquid film 142 may flow in the gap 134 and in contact with the first surface 131. In this way, the liquid film 142 may interact with the first surface 131 so to implement certain effects on the first surface 131, for example etching and/or cleaning the first surface 131. The liquid film 142 drains off the gap 134 from the edge of the chuck 110.

In various embodiments, the semiconductor substrate 130 is not spun or revolved during the process time, and therefore the apparatus disclosed herein is advantageous to process a large-size substrate because the substrate is in a static condition. In conventional techniques, the semiconductor substrate is rotated during the process time, and unfavorably leads to bending of the semiconductor substrate. Accordingly, the apparatus 100 provided herein is suitable for processing large-size substrates such as for example 18-inch wafers or larger. Nevertheless, the present disclosure is not limited to specific semiconductor substrates, and any semiconductor substrate may be used in the present disclosure.

The positive pressure unit 150 is configured to provide a gas flow 152 to a space over the chuck 110. When the apparatus 100 is under operation, the gas flow 152 is supplied to the second surface 132 of the semiconductor substrate 130, and the gas flow 152 blows over the edge of the second surface 132, and then leaves the second surface 132 of the semiconductor substrate 130. In some embodiments, the positive pressure unit 150 includes a cover 154 and a first gas supplier 156 connecting to the cover 154. When the apparatus 100 is under operation, the cover 154 is moved to a position above the semiconductor substrate 130, covering the semiconductor substrate 130. The first gas supplier 156 supplies the gas flow 152 into the space between the cover 154 and the second surface 132 of the semiconductor substrate 130, and a positive pressure space 158 is therefore created over the second surface 132 of the semiconductor substrate 130. The gas supplied by the first gas supplier 156 flows out of the space 158 from the edge of the semiconductor substrate 130. In some examples, the gas flow 152 includes nitrogen gas, air or other suitable gas.

It is noted that the problems of "backwash" are effectively resolved by the arrangement of the positive pressure unit 150, the semiconductor substrate 130 and the chuck 110 disclosed herein. First, the semiconductor substrate 130 is arranged above the liquid film 142 which serves as the working medium. When the liquid film 142 leaves the principal surface 110A of the chuck 110, the outflow liquid 148 substantially flows downwards due to the gravity effect, and this considerably decreases the possibility of "backwash". Second, the gas supplied from the positive pressure unit 150 create a positive pressure space 158 on the second surface 132 of the semiconductor substrate 130, and the positive pressure space 158 prevents the outflow liquid 148 from splashing onto the second surface 132 of the semiconductor substrate 130. Furthermore, the gas flow 152 blowing over the edge of the semiconductor substrate 130 directs the outflow liquid 148 to flow downwards. Accordingly, the second surface 132 of the semiconductor substrate 130 is free of any liquid splashed or moved from liquid film 142, and the problems regarding "backwash" are effectively resolved in various embodiments of the present disclosure.

In some embodiments, the apparatus 100 further includes a drainage unit 160 disposed adjacent to an edge of the chuck 110. The drainage unit 160 is configured to drain liquid 148 from the edge of the chuck 110. In some examples, the drainage unit 160 includes a first suction head 162 neighboring the edge of the chuck 110. The first suction head 162 is positioned at a level between the first surface 131 of the semiconductor substrate 130 and the principal surface 110A of the chuck 110, and the outflow liquid 148 is sucked into the first suction head 162. Significantly, the first suction head 162 and gas flow 152 blowing over the edge of the semiconductor substrate 130a constitute a gas stream at the edge of the semiconductor substrate 130 and the edge of the liquid film 142. The constituted gas stream directs the outflow liquid 148 into the first suction head 162, and effectively prevents the liquid 148 from splashing onto the second surface 132 of the semiconductor substrate 130. In yet some examples, the drainage unit 160 further includes a second suction head 164 positioned at a level below the principal surface 110A. The second suction head 164 may suck remained liquid under the first suction head 162.

In some embodiments, the apparatus 100 further includes a nebulizer 170 connected to the hole(s) 112. The nebulizer 170 is configured to supply a spray or droplets to the first surface 131 of the semiconductor substrate 130 through the hole(s) 112 of the chuck 110. The spray or droplets supplied from the nebulizer 170 is for the purpose of wetting the first surface 131 before forming the liquid film 142. In examples, the nebulizer 170 may be an ultrasonic nebulizer or the likes.

In some embodiments, the apparatus 100 further includes a second gas supplier 180 connected to the holes 112. The second gas supplier 180 may supply suitable gas or air to the first surface 131 of the semiconductor substrate 130 through the hole(s) 112 of the chuck 110.

In some embodiments, the apparatus 100 further includes a rotator 190 connected to the chuck 110. The chuck 110 may be rotated or revolved when the apparatus 100 is under operation. The rotation of the chuck 110 may enhance the cleaning and/or etching effects according to some embodiments of the present disclosure. In examples, the rotator 190 may be driven by a driving device 190a. The driving device 190a may programmably control the rotation of the chuck 110 when the apparatus 100 is under operation.

Figure 2A:
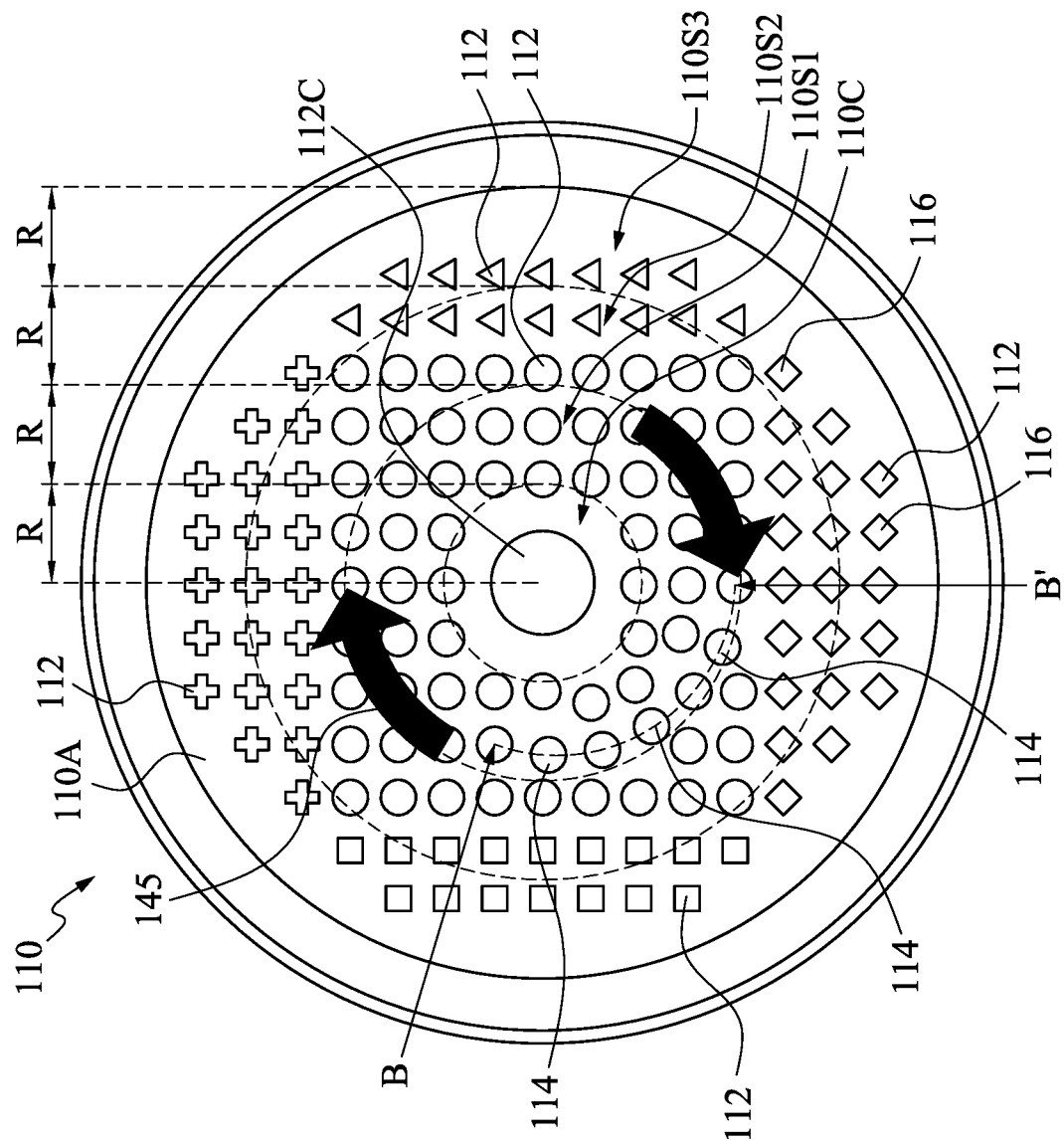
FIG. 2A is a top view schematically illustrating a chuck according to various embodiments of the present disclosure.

FIG. 2A is a top view schematically illustrating the chuck 110 according to various embodiments of the present disclosure.

In various embodiments, the principal surface 110A of the chuck 110 has a central region and one or more annular regions surrounding the central region. For example, the principal surface 110A has a central region 110C and a number of annular regions 110S1, 110S2, 110S3, in which the central region 110A has a radius R, and each of the annular regions 110S1, 110S2 and 110S3 has a width R. In some embodiments, the chuck 110 and/or the liquid supplying system 140 are designed to supply a greater liquid amount onto the central region 110C than each of the annular regions 110S1, 110S2 and 110S3. In yet some embodiments, the liquid amount supplied onto an inner annular region is greater than that supplied onto an outer annular region. For example, the liquid amount supplied onto the annular region 110S1 is greater than that supplied onto the annular region 110S2, and further the liquid amount supplied onto the annular region 110S2 is greater than that supplied onto the annular region 110S3. In some examples, the liquid amount supplied onto the annular region 110S1 is about 60-80% of that supplied onto the central region 110C, the liquid amount supplied onto the annular region 110S2 is about 30-50% of that supplied onto the central region 110C, and the liquid amount supplied onto the annular region 110S3 is about 18-38% of that supplied onto the central region 110C.

In some embodiments, the holes 112 are arranged in the central region 110C and the annular regions 110S1, 110S2, 110S3, as illustrated in FIG. 2A. The total area of the outlets of the holes 112 in the central region 110C is greater than that in each of the annular regions 110S1, 110S2 and 110S3. Further, the total area of outlets of the holes 112 in an inner annular region is greater than that in an outer annular region. For example, the total area of the outlets of the holes 112 in the annular region 110S1 is greater than that in the annular region 110S2, and further the total area of the outlets of the holes 112 in the annular region 110S2 is greater than that in the annular region 110S3. In some examples, the total area of the outlets of the holes 112 in the annular region 110S1 is about 60-80% of that in the central region 110C, the total area of the outlets of the holes in the annular region 110S2 is about 30-50% of that in the central region 110C, and the total area of the outlets of the holes 112 in the annular region 110S3 is about 18-38% of that in the central region 110C. In yet some examples, the holes 112 include a central hole 112C positioned at the center of chuck 110, and the central hole 112C has the largest area. In addition, there is no specific limitation on the shapes of the holes 112. Illustrated shapes of the outlets of the holes 112 include circles, triangles, rectangles, rhombuses, crosses and other shapes.

In some embodiments, the holes 112 may include a number of discharge holes 116 to drain off the liquid on the principal surface 110A. The discharge holes 116 may be connected to a drainage device such as for example a suction pump.

Figure 2B:
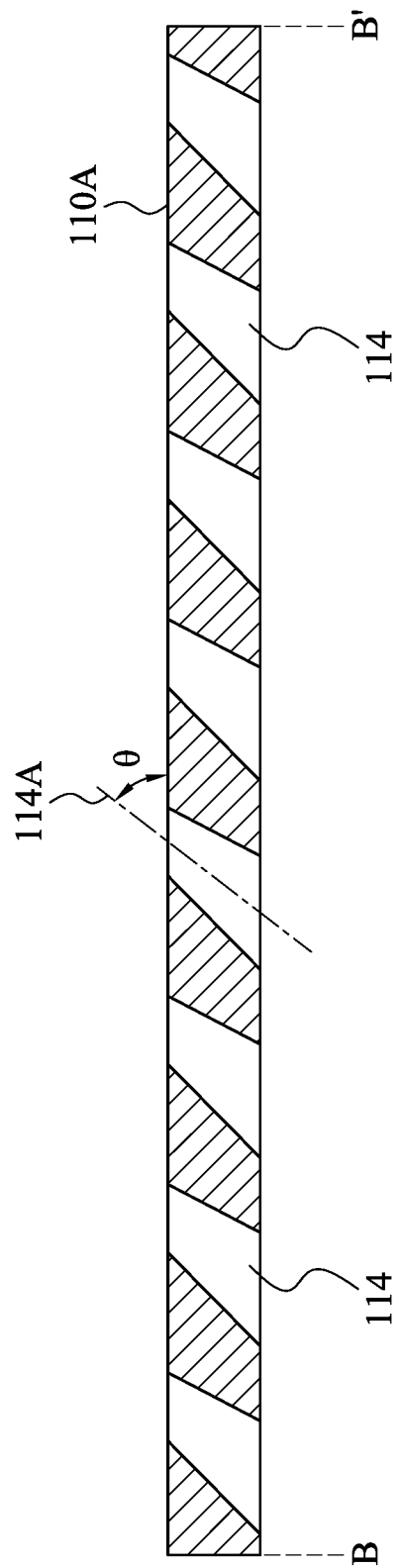
FIG. 2B is a cross-sectional view along line BB' in FIG. 2A.

FIG. 2B is a cross-sectional view along line BB' in FIG. 2A. According to yet some embodiments of the present disclosure, the holes 112 may include a number of swirling holes 114 for creating a swirl flow 145 of the liquid film 142 on the principal surface 110A of the chuck 110, in a clockwise direction or counterclockwise direction. The swirl flow 145 of the liquid film 142 may facilitate the uniformity of etching or cleaning effect on the first surface 131 of the semiconductor substrate 130. Each of the swirling holes 114 has an axis 114A, and each axis 114A and the principal surface 110A form an included angle θ of less than 90 degrees. In some examples, the included angle θ may range from about 10 degrees to about 80 degrees, specifically about 15 degrees to about 65 degrees, more specifically about 20 degrees to about 60 degrees. In some examples, when the included angle θ is less than a certain value such as for example 10 degrees, some nanometer structures on the first surface 131 may be damaged. On the other hand, in yet some examples, when the included angle θ is greater than a certain value such as for example 80 degrees, the washing and/or etching effect on the first surface 131 of the semiconductor substrate 130 is unsatisfied.

Another aspect of the present disclosure is to provide a method of processing a semiconductor substrate such as for example etching or cleaning the semiconductor substrate. FIG. 3 is a flow chart illustrating a method 10 of processing a semiconductor substrate according to various embodiment of the present disclosure. The method 10 includes operation 12, operation 14, operation 16, operation 18 and operation 20. FIGS. 4-11 collectively illustrate more detailed manufacturing methods as a series of cross-sectional views in accordance with various embodiments of the present disclosure. It will be appreciated that although these methods each illustrate a number of operations, acts and/or features, not all of these operations, acts and/or features are necessarily required, and other un-illustrated operations, acts and/or features may also be present. Also, the ordering of the operations and/or acts in some embodiments can vary from what is illustrated in these figures. In addition, the illustrated operations and/or acts can be further divided into sub-acts in some implementations, while in other implementations some of the illustrated operations and/or acts can be carried out concurrently with one another. It should be noted that the fabrication stages as well as the features in connection with FIGS. 4-11 are merely examples. A person skilled in the art will recognize there may be many alternatives, variations and modifications.

In operation 12, a semiconductor substrate 130 is disposed above a chuck 110, as illustrated in FIG. 4. The chuck 110 has a principal surface 110A and a plurality of holes 112 formed thereon. The semiconductor substrate 130 has a first surface 131 to be processed and facing the principal surface 110A. The semiconductor substrate 130 further has a second surface 132 opposite to the first surface 131. The semiconductor substrate 130 is spaced apart from the principal surface 110A of the chuck 110 by a gap 134.

In some embodiments, the method 10 further includes an act of providing a spray 172 to the first surface 131 through the holes 112 after the operation 12 but prior to the operation 14. In some examples, the spray 172 or droplet is provided for wetting the first surface 131 of the semiconductor substrate 130, and the wetting process may facilitate the following operation 14. In some examples, the act of providing the spray 172 to the first surface 131 may include applying a nebulizer 170 such as an ultrasonic nebulizer to generate the spray 172.

In operation 14, as illustrated in FIG. 5, a flowing liquid layer 143 is formed on the principal surface 110A of the chuck 110 by supplying liquid 141 to the principal surface 110A through the holes 112. In some embodiments, the liquid amount supplied to the central region 110C of the chunk is greater than that supplied to the outer annular region 110S, and the liquid layer 143 therefore has a higher surface in the central region 110C, as compared to the outer annular region 110S. In some examples, the height H1 of the liquid layer 143 in the central region 110C is about 10 mm to about 50 mm, specifically about 12 mm to about 30 mm, more specifically about 15 mm to about 25 mm. In some examples, the supplied liquid may include etching chemicals and/or cleaning liquid.

Figure 6:
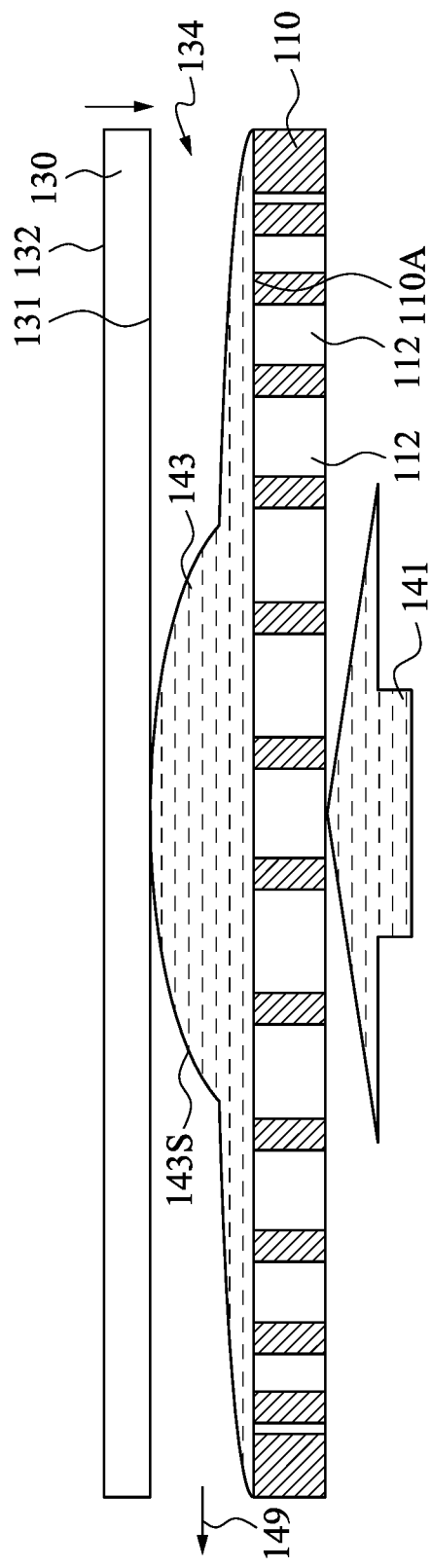
Figure 7:
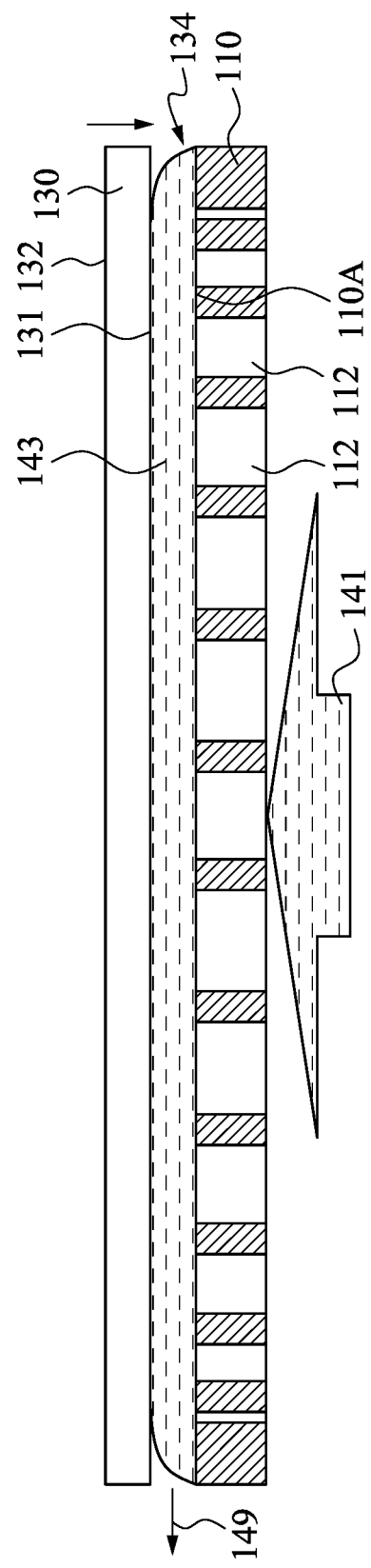

In operation 16, as illustrated in FIG. 6-8, the first surface 131 of the semiconductor substrate 130 is allowed to be in contact with the liquid layer 143 such that the liquid layer 143 flows in the gap 134 between the first surface 131 and the principal surface 110A of the chuck 110. In FIG. 6, the semiconductor substrate 130 is moved down to softly touch the central portion of the liquid layer 143 with a high liquid surface in the central region 110C. In FIG. 7, the semiconductor substrate 130 is continuously moved down so that the air 149 between the liquid surface 143S and the first surface 131 of the semiconductor substrate 130 may be discharged. In some examples, the acts illustrated in FIGS. 6-7 may be repeated several times so to reliably wet the first surface 131 and drive out the air trapped on the first surface 131. Particularly, the semiconductor substrate 130 may be moved cyclically upwards and downwards in the operation 16. In FIG. 8, the semiconductor substrate 130 is continuously moved down and positioned above the principal surface 110A of the chuck 110. In this stage, the liquid is continuously supplied from the holes 112 of the chuck 110, and the supplied liquid flows from the holes 112 through the gap 134 to the edge of the chuck 110, and then leaving the chuck 110. In some examples, the gap 134 is maintained in the range of about 0.1 mm to about 5 mm, specifically about 0.2 mm to about 4 mm, more specifically about 1 mm to about 4 mm in the stage illustrated in FIG. 8. In some examples, the operation 16 includes removing a material from the first surface 131 of the semiconductor substrate 130.

In operation 18, a gas flow 152 is provided to the second surface 132 of the semiconductor substrate 130. It is noted that the operation 18 may be started prior to or during the operation 16. In some examples, the operation 18 and the operation 16 are concurrently carried out. In yet some examples, the operation 18 is started with the operation 14 and continues until or after the end of the operation 16. In some embodiments, the operation 18 includes creating a positive pressure space 158 above the second surface 132.

In operation 20, the liquid layer 143 is drained from the edge of the chuck 110, as illustrated in FIG. 9. In some embodiments, the act of supplying the liquid 141 from the holes 112 is stopped, and then a dry gas 182 is supplied through the holes 112 to the gap 134 between the first surface 131 and the principal surface 110A, and thereby driving the remained liquid layer 143 out of the gap 134. In yet some embodiments, the act of supplying the liquid 141 from the holes 112 is stopped, but another liquid is subsequently supplied through the holes 112 to the principal surface 110A. For example, the previously supplied liquid may be a first liquid such as for example etching solution, and the subsequently supplied liquid may be a second liquid such as for example cleaning solution. In yet some embodiments, the method 10 may include any repeated operation or act described hereinbefore in connection with any of FIGS. 4-9.

Figure 10:
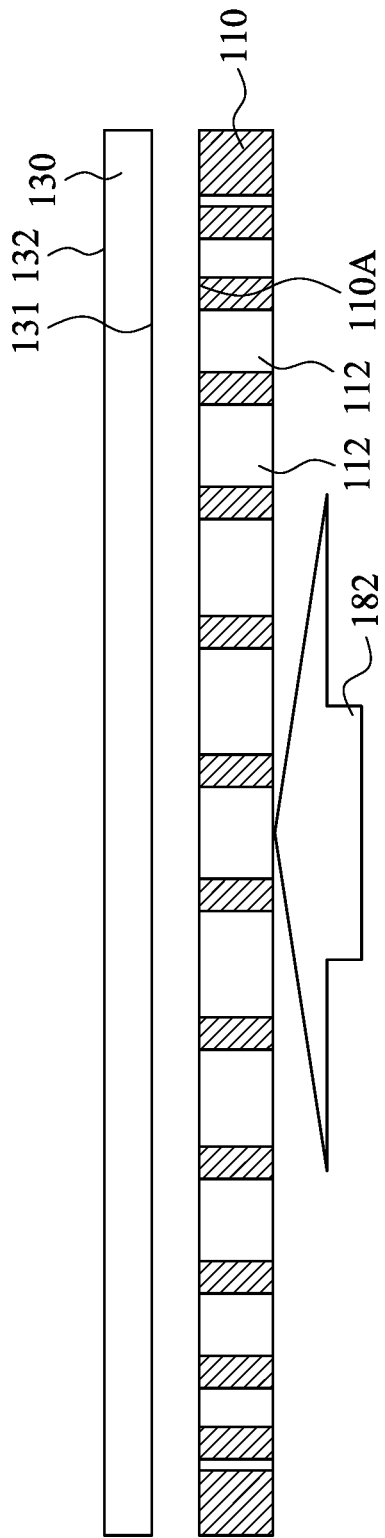
Figure 11:
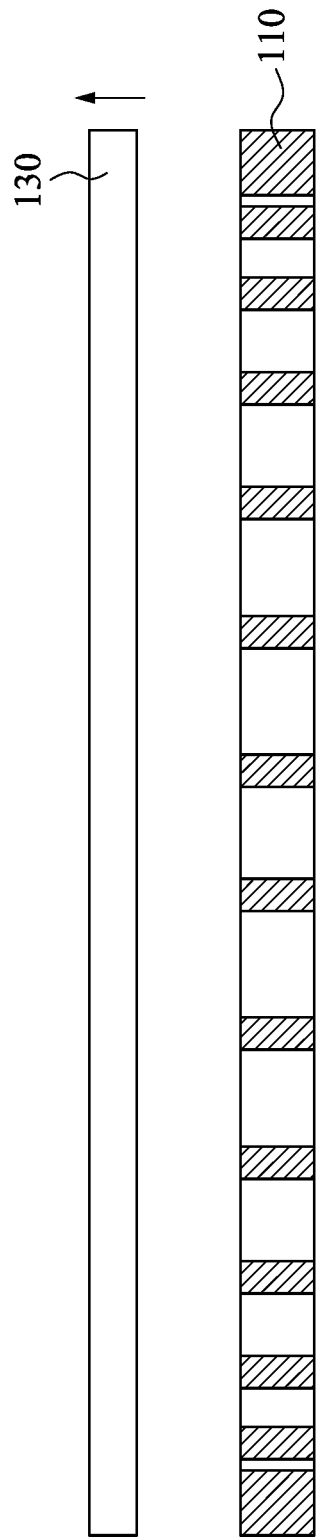

After the operation 20, the method may further include other operations or acts. For example, as illustrated in FIG. 10, the first surface 131 of the semiconductor substrate 130 is dried when the dry gas 182 is continuously supplied. Thereafter, the semiconductor substrate 130 may be moved upwards, as illustrated in FIG. 11.

Advantages of various embodiments of the present disclosure include providing a novel apparatus of processing a semiconductor substrate, and a novel method of processing a semiconductor substrate. The apparatus and method can reliably promise the non-processing surface being free of the working mediums such as for example cleaning liquid and/or etching liquid. Furthermore, the apparatus and method disclosed herein may resolve the issues that the nanometer features such as for example the fin structures of FinFETs are broken or damaged in the cleaning processes and/or wet etching processes. Further, the apparatus and method disclosed herein are suitable for processing large-size substrates.

In accordance with one aspect of some embodiments, a method is provided. A semiconductor is disposed over a chuck. The chuck has a plurality of holes therein. The semiconductor substrate has a first surface facing the chuck and a second surface opposite thereto. A liquid layer is formed flowing over a top surface of the chuck by supplying liquid to the top surface of the chuck through the holes of the chuck. The semiconductor substrate is moved toward the chuck such that the first surface of the semiconductor substrate is in contact with the liquid layer and the liquid layer flows between the first surface of the semiconductor substrate and the top surface of the chuck.

In accordance with one aspect of some embodiments, a method is provided. A semiconductor substrate is disposed over a chuck. A liquid is supplied over the chuck. The semiconductor substrate is allowed to be in contact with the liquid. The semiconductor substrate is vertically moved when the semiconductor substrate is in contact with the liquid.

In accordance with one aspect of some embodiments, a method is provided. A semiconductor substrate is disposed over a chuck. The chuck has a plurality of holes therein, and the semiconductor substrate has opposite first and second surfaces. A liquid is supplied over the chuck through the holes of the chuck. The liquid exiting each of the holes of the chuck has a first velocity component substantially parallel to the first surface of the semiconductor substrate, and a second velocity component substantially perpendicular to the first surface of the semiconductor substrate. The first surface of the semiconductor substrate is allowed to be in contact with the liquid.

What is claimed is:

1. A method, comprising:
    disposing a semiconductor substrate over a chuck, wherein the chuck has a plurality of holes therein, and the semiconductor substrate has a first surface facing the chuck and a second surface opposite thereto;
    providing a spray to the first surface of the semiconductor substrate through the holes of the chuck;
    after providing the spray to the first surface of the semiconductor substrate, forming a liquid layer flowing over a top surface of the chuck by supplying liquid to the top surface of the chuck through the holes of the chuck; and
    moving the semiconductor substrate toward the chuck such that the first surface of the semiconductor substrate is in contact with the liquid layer and the liquid layer flows between the first surface of the semiconductor substrate and the top surface of the chuck.

2. The method according to claim 1, further comprising providing a gas flow to the second surface of the semiconductor substrate.

3. The method according to claim 1, further comprising draining the liquid layer from an edge of the chuck.

4. The method according to claim 1, further comprising pushing the liquid layer toward an edge of the chuck by supplying a gas to the top surface of the chuck through the holes of the chuck.

5. The method according to claim 1, wherein the liquid supplied to the top surface of the chuck through the holes of the chuck comprises an etching chemical.

6. The method according to claim 1, wherein the liquid supplied to the top surface of the chuck through the holes of the chuck comprises a cleaning solution.

7. A method, comprising:
    disposing a semiconductor substrate over and spaced apart from a chuck;
    after disposing the semiconductor substrate, supplying a liquid over a principal surface of the chuck;
    moving the semiconductor substrate down to the liquid after supplying the liquid over the principal surface of the chuck; and
    vertically moving the semiconductor substrate when the semiconductor substrate is in contact with the liquid.

8. The method according to claim 7, wherein vertically moving the semiconductor substrate when the semiconductor substrate is in contact with the liquid comprises vertically moving the semiconductor substrate toward the chuck such that a height of the liquid is decreased.

9. The method according to claim 7, wherein vertically moving the semiconductor substrate when the semiconductor substrate is in contact with the liquid comprises vertically moving the semiconductor substrate away from the chuck such that a height of the liquid is increased.

10. The method according to claim 7, wherein vertically moving the semiconductor substrate when the semiconductor substrate is in contact with the liquid comprises cyclically moving the semiconductor substrate toward and away from the chuck such that a height of the liquid is successively decreased and increased.

11. The method according to claim 7, wherein the chuck has a central region and a first annular region surrounding the central region, a radius of the central region is substantially equal to an annular width of the first annular region, and supplying the liquid over the chuck comprises supplying a greater amount of the liquid over the central region of the chuck than that over the first annular region of the chuck.

12. The method according to claim 11, wherein the chuck has a second annular region surrounding the first annular region, an annular width of the second annular region is substantially equal to the annular width of the first annular region, and supplying the liquid over the chuck comprises supplying a greater amount of the liquid over the first annular region of the chuck than that over the second annular region of the chuck.

13. The method according to claim 7, further comprising:
    providing a spray to a surface of the semiconductor substrate prior to moving the semiconductor substrate down to the liquid.

14. A method, comprising:
    disposing a semiconductor substrate over a chuck, wherein the chuck has a plurality of holes therein, and the semiconductor substrate has opposite first and second surfaces;
    wetting the first surface of the semiconductor substrate facing toward the chuck by using a spray;
    after wetting the first surface of the semiconductor substrate by using the spray, supplying a liquid over the chuck through the holes of the chuck, wherein the liquid exiting each of the holes of the chuck has a first velocity component substantially parallel to the first surface of the semiconductor substrate, and a second velocity component substantially perpendicular to the first surface of the semiconductor substrate; and
    allowing the first surface of the semiconductor substrate to be in contact with the liquid.

15. The method according to claim 14, wherein the plurality of holes of the chuck comprises a plurality of swirling holes.

16. The method according to claim 14, wherein the chuck comprises a top surface and a bottom surface, and each of the holes of the chuck extends from the bottom surface of the chuck to the top surface of the chuck and has an axis inclined with respect to the top surface of the chuck.

17. The method according to claim 16, wherein the axis of each of the holes of the chuck and the top surface of the chuck form an included angle, and the included angle is in a range from about 10 degrees to about 80 degrees.

18. The method according to claim 14, wherein when supplying the liquid over the chuck through the holes of the chuck, the chuck is rotating such that the liquid exiting each of the holes of the chuck has the first velocity component substantially parallel to the first surface of the semiconductor substrate.

19. The method according to claim 14, further comprising vertically moving the semiconductor substrate when the semiconductor substrate is in contact with the liquid.

20. The method according to claim 14, further comprising supplying a gas to the first surface of the semiconductor substrate through the holes of the chuck.

* * * * *